(12) United States Patent
Seid et al.

(10) Patent No.: US 10,666,024 B2
(45) Date of Patent: May 26, 2020

(54) HOUSING FOR AN ELECTRICAL APPLIANCE

(71) Applicant: Pilz GmbH & Co. KG, Ostfildern (DE)

(72) Inventors: Jörg Seid, Ostfildern (DE); Tobias Hampe, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 0 days.

(21) Appl. No.: 16/295,843

(22) Filed: Mar. 7, 2019

(65) Prior Publication Data
US 2019/0245329 A1 Aug. 8, 2019

Related U.S. Application Data

(63) Continuation of application No. PCT/EP2017/077650, filed on Oct. 27, 2017.

(30) Foreign Application Priority Data

Oct. 31, 2016 (DE) .......................... 10 2016 120 734

(51) Int. Cl.
*H01R 9/22* (2006.01)
*H02B 1/052* (2006.01)
(Continued)

(52) U.S. Cl.
CPC .............. *H02B 1/052* (2013.01); *H01H 9/02* (2013.01); *H01H 9/04* (2013.01); *H01H 13/04* (2013.01);
(Continued)

(58) Field of Classification Search
CPC ........ H02B 1/052; H02B 1/40; H05K 5/0204; H05K 5/0208
(Continued)

(56) References Cited

U.S. PATENT DOCUMENTS 4,269,471 A * 5/1981 Woertz ................. H01R 9/2691
439/716
5,842,889 A * 12/1998 Kollmann .............. H02B 1/052
439/716
(Continued)

FOREIGN PATENT DOCUMENTS

CN 1136227 A 11/1996
DE 69300295 T2 1/1996
(Continued)

OTHER PUBLICATIONS

Office Action in corresponding Chinese Patent Application No. 201780064021.1, dated Mar. 23, 2020, with English translation.

*Primary Examiner* — Abdullah A Riyami
*Assistant Examiner* — Vladimir Imas
(74) *Attorney, Agent, or Firm* — Edell, Shapiro & Finnan, LLC

(57) ABSTRACT

A housing for an electrical device comprises a housing bottom, a fastening element, and an unlocking element and is closeable by a housing cover. The housing bottom includes an elastically deformable connecting section to connect the housing to a machine, a technical system, or a building wall. The fastening element is disposed on an outer face of the connecting section and is connectable in a form-fitting and/or friction-fitting manner to a corresponding retaining element of the machine, the technical system, or the building wall. The unlocking element is disposed on an inner face of the connecting section and is operatively connected to the fastening element. The unlocking element is user actuatable only from an inside of the housing when the housing is open in order to release the form-fitting and/or friction-fitting connection of the fastening element to the retaining element of the machine, the technical system, or the building wall.

9 Claims, 4 Drawing Sheets

(51) Int. Cl.
*H01H 9/02* (2006.01)
*H02B 1/40* (2006.01)
*H05K 5/02* (2006.01)
*H01H 9/04* (2006.01)
*H01H 13/06* (2006.01)
*H01H 13/04* (2006.01)

(52) U.S. Cl.
CPC ............... *H01H 13/06* (2013.01); *H02B 1/40* (2013.01); *H05K 5/0204* (2013.01); *H05K 5/0208* (2013.01); *Y02B 10/30* (2013.01)

(58) Field of Classification Search
USPC ........................................................ 439/715
See application file for complete search history.

(56) References Cited

U.S. PATENT DOCUMENTS

| | | | |
|---|---|---|---|
| 6,059,129 A | 5/2000 | Bechaz et al. | |
| 6,371,435 B1 * | 4/2002 | Landis | H02B 1/052 248/694 |
| 7,151,236 B2 * | 12/2006 | Ducruet | H01H 13/48 200/406 |
| 7,516,927 B2 * | 4/2009 | Portal | H01R 9/2608 248/221.11 |
| 9,353,777 B2 * | 5/2016 | Eminovic | H02B 1/052 |
| 9,374,924 B2 * | 6/2016 | Boretti | H05K 7/1401 |
| 9,466,442 B2 * | 10/2016 | Santos | H01H 9/285 |
| 9,583,286 B2 * | 2/2017 | Mau | H01H 13/14 |
| 9,646,786 B1 * | 5/2017 | Feng | H01H 13/86 |
| 9,870,880 B2 * | 1/2018 | Zercoe | H01H 13/023 |
| 10,083,805 B2 * | 9/2018 | Knopf | H01H 13/023 |
| 10,083,806 B2 * | 9/2018 | Knopf | H01H 13/023 |
| 10,115,541 B2 * | 10/2018 | Wakuda | H05K 1/181 |
| 10,115,544 B2 * | 10/2018 | Wu | H01H 13/88 |
| 10,262,814 B2 * | 4/2019 | Hendren | H01H 13/14 |
| 2002/0056627 A1 * | 5/2002 | Rochon | H01H 13/7006 200/302.2 |
| 2015/0115044 A1 | 4/2015 | Claber et al. | |

FOREIGN PATENT DOCUMENTS

| | | |
|---|---|---|
| DE | 19504762 C2 | 8/2002 |
| DE | 102015201916 A1 | 8/2016 |

* cited by examiner

HOUSING FOR AN ELECTRICAL APPLIANCE

CROSS REFERENCE TO RELATED APPLICATIONS

This application is a continuation of International Application No. PCT/EP2017/077650, filed on Oct. 27, 2017, which claims priority under 35 U.S.C. § 119 to Application No. DE 102016120734.9 filed on Oct. 31, 2016, the entire contents of which are hereby incorporated by reference.

TECHNICAL FIELD

The present disclosure relates to a housing for an electrical device, the housing comprising a housing bottom, which has a connecting section for connecting the housing to a machine, a technical system, or a building wall, and at least one fastening element, which is provided on an outer face of the connecting section, wherein the fastening element is designed such that it can be connected in a form-fitting and/or friction-fitting manner to a corresponding retaining element of the machine, the technical system or the building wall, and wherein the housing can be closed by a housing cover.

BACKGROUND

Housings of the type, mentioned in the introduction, for an electrical device, which may be, for example, an emergency stop device of a dangerous machine or a technical system, are known from the prior art in a variety of embodiments. In particular, in the case of housings for emergency stop devices, it is known, for example, to screw the housings tightly to a base or a retainer after previously opening the housing with its housing bottom. In order to make the assembly particularly easy, there exist electrical devices that can already be completely wired by the manufacturer and then during assembly can be fastened without tools to a retainer, which has been pre-configured for this purpose and provided on the machine or alternatively the technical system, in particular, can be snapped onto a retaining element of the retainer. Such housings have the drawback that the fastening element, with which the housing is interlocked with the retaining element, is accessible from the outside. Therefore, after installation, these electrical devices can be easily deinstalled again with little effort and then optionally reinstalled such that this reinstallation would not be detectable later on. An unauthorized deinstallation and reinstallation of electrical devices can present a problem, in particular, in the case of safety-critical machines or technical systems.

The published document DE 195 04 762 C2 discloses a device to snap a housing of an electrical device onto a mounting rail profile. The unlocking mechanism consists of a pull rod, which can be mounted laterally or inside the housing. By pulling on the pull rod, a spreader bar is moved into its operating position on the underside of the housing, and the housing can be removed from the mounting rail.

The published document DE 10 2015 201 916 A1 discloses a housing of an electrical device that can be snapped onto a top-hat rail. The locking of the housing to the retainer takes place via an eccentric element on the rear side of the housing. In this case the eccentric element is rotatably actuated from the front side of the housing by a torsion bar and a control element. The housing can be disassembled together with the locking apparatus.

In the case of the two solutions mentioned above, there is no way to detect an unauthorized disassembly of the housing from the retainer. Furthermore, these housings have corresponding openings, through which the tension rod or alternatively the torsion bar is passed. As a result, it is not possible or only with considerable effort is it possible to provide a housing with a greater level of protection, in particular, with the IP65 level of protection.

SUMMARY

An object of what is disclosed is to provide a housing that can be easily fastened to a retaining element of a retainer and offers improved protection against unauthorized disassembly.

A housing in accordance with the present disclosure is characterized by the feature that the connecting section is designed to be elastically deformable and comprises on an inner face an unlocking element, which can be actuated by a user and which is operatively connected to the fastening element and is designed such that it can be actuated only from the inside when the housing is opened, in order to release the form-fitting and/or friction-fitting connection of the fastening element to the retaining element of the machine, the technical system, or the building wall. The idea is that the housing can be released again from the retainer only after the housing cover has been removed, since only then is it possible for the user to reach and to actuate the unlocking element, which is operatively connected to the fastening element. The connecting section with the fastening element is designed such that the fastening element is covered by the housing after the housing has been mounted on the retaining element of the retainer on the side of the machine or alternatively the technical system or even the building; and, as a result, the fastening element is not accessible from the outside, so that the housing cannot be disassembled without destroying it. Preferably the housing comprises at least one tamper-proof mechanism, which is designed such that it is damaged when the housing is opened. The tamper-proof mechanism may be, for example, a sticker, which is pasted over a parting line between the housing and the housing cover or at least one fastener, by which the housing cover can be fastened to the housing. Opening the housing will damage the sticker. Thus, tampering with the housing by an unauthorized opening thereof can be reliably detected. In the event of a defect the housing can be replaced in a short period of time even by persons who do not have the specialized skill. For this purpose, only the housing cover has to be removed, and the unlocking element has to be actuated. However, a disassembly of the housing, in particular, for repair or replacement purposes, is quite deliberately not possible without damaging the tamper-proof mechanism. The assembly of the housing is also very simple, since the housing does not have to be opened for assembly purposes. Another advantage of the housing is that the housing has no openings, through which a handling mechanism for the unlocking element has to be passed from the outside. As a result, it is very easily possible to provide a housing with a greater level of protection, in particular, with the IP65 level of protection.

In order to achieve an optimum force transmission from the unlocking element to the fastening element when unlocking the housing, it is proposed in a preferred embodiment that the fastening element and the unlocking element be arranged opposite one another on the connecting section.

In order to simplify the manufacture of the housing, it can be provided in a particularly advantageous embodiment that the fastening element is integrally formed with the connecting section. It is just as advantageous that the unlocking element is integrally formed with the connecting section. It is particularly advantageous if both the fastening element and the unlocking element are integrally formed with the connecting section, since in this embodiment no additional manufacturing and assembly steps are required to produce the fastening element and the unlocking element and to fasten them to the connecting section. However, in principle, it is also possible to design the fastening element and/or the unlocking element as separate components and to fasten it/them to the connecting section in a suitable manner.

In a preferred embodiment the unlocking element may be designed such that it can be grasped by a gripping tool, for example, by gripping pliers. This embodiment of the unlocking element provides a simple and user-intuitive type of unlocking of the housing from the retaining element.

Preferably the fastening element can be designed such that it can be released from the retaining element of the machine, the technical system or the building wall by exerting a tensile force. As an alternative, there is also the option that the fastening element is designed such that it can be released from the retaining element of the machine, the technical system or the building wall by exerting a compressive force.

It can be provided in an advantageous embodiment that the connecting section has a concentric, elastically deformable undulating structure, extending around the fastening element and/or the unlocking element. As a result, it is possible to achieve the elastic deformability of the connecting section in a simple way. Preferably, the elastically deformable undulating structure may be formed by at least two ring-shaped ridges and at least one ring-shaped indentation between the ridges. This undulating structure reduces the rigidity of the connecting section and, in so doing, enables the elastic deformation thereof in a simple manner.

In order to make the manufacture of the housing particularly simple, it is proposed in a particularly advantageous embodiment that the connecting section be integrally formed with the housing bottom. Hence, the housing is preferably a one-piece component, which can be produced, for example, by a plastic injection molding process. Since the connecting section is integrally formed with the housing bottom and is already produced in the course of manufacturing the housing, there is no need for additional assembly steps to fasten the connecting section to the housing bottom and to seal in an appropriate manner, unless it should be required by the level of protection of the housing that is to be achieved. In this context it is particularly advantageous that the fastening element and the unlocking element are integrally formed with the connecting section.

In principle, however, it is also conceivable that the connecting section is formed as a separate component, which is inserted into a suitably shaped, receiving opening, provided within the housing bottom, and is fixed in the receiving opening. However, this variant has the drawback that the connection of the connecting section to the housing can be sealed only with considerable effort. Therefore, this embodiment is more suitable for housings having a low level of protection.

BRIEF DESCRIPTION OF THE DRAWINGS

Other features and advantages of the described housing will become apparent from the following description of an example implementation with reference to the accompanying drawings.

DETAILED DESCRIPTION

With reference to FIGS. 1 to 4, a housing 1 for an electrical device, such as, for example, an emergency stop device of a machine or technical system, comprises a housing bottom 10, a circumferential inner housing wall 11, and a circumferential outer housing wall 12. The housing 1, which is made of plastic, has a substantially rectangular, in the present case substantially square, contour. The circumferential inner wall 11, that is, extending in the circumferential direction, defines an inner receiving space of the housing 1, within which the component parts of the electrical device can be accommodated. The housing 1 can be closed by a housing cover, which is also made of plastic, and can be sealed such that it can achieve a greater level of protection, in particular, the IP65 level of protection. An electrical connection can be implemented, for example, by plugging in an industry standard, five pin M12 connector.

Figure 1:
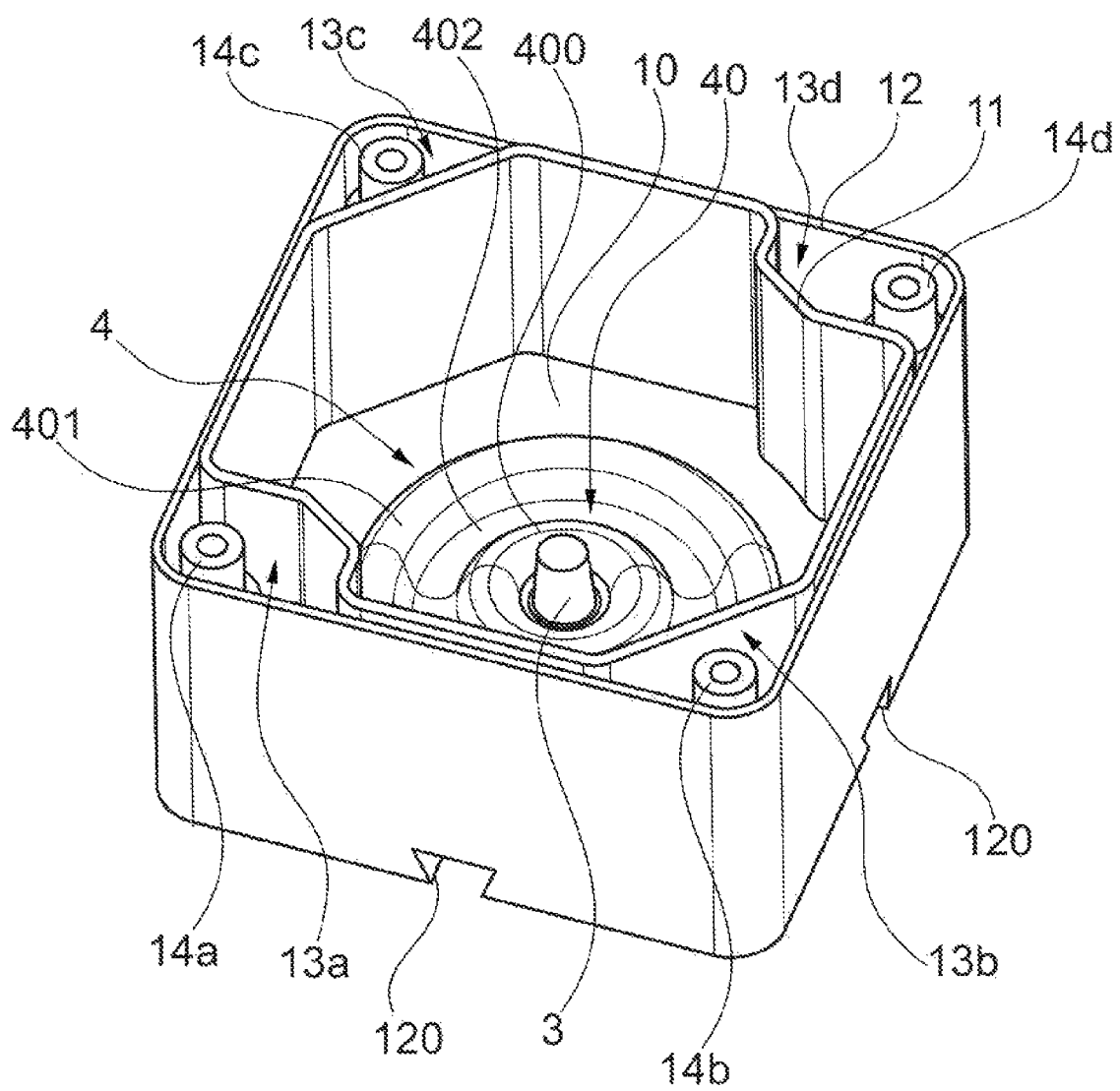
FIG. 1 is a perspective view of an example implementation of a housing for an electrical device.
Figure 2:
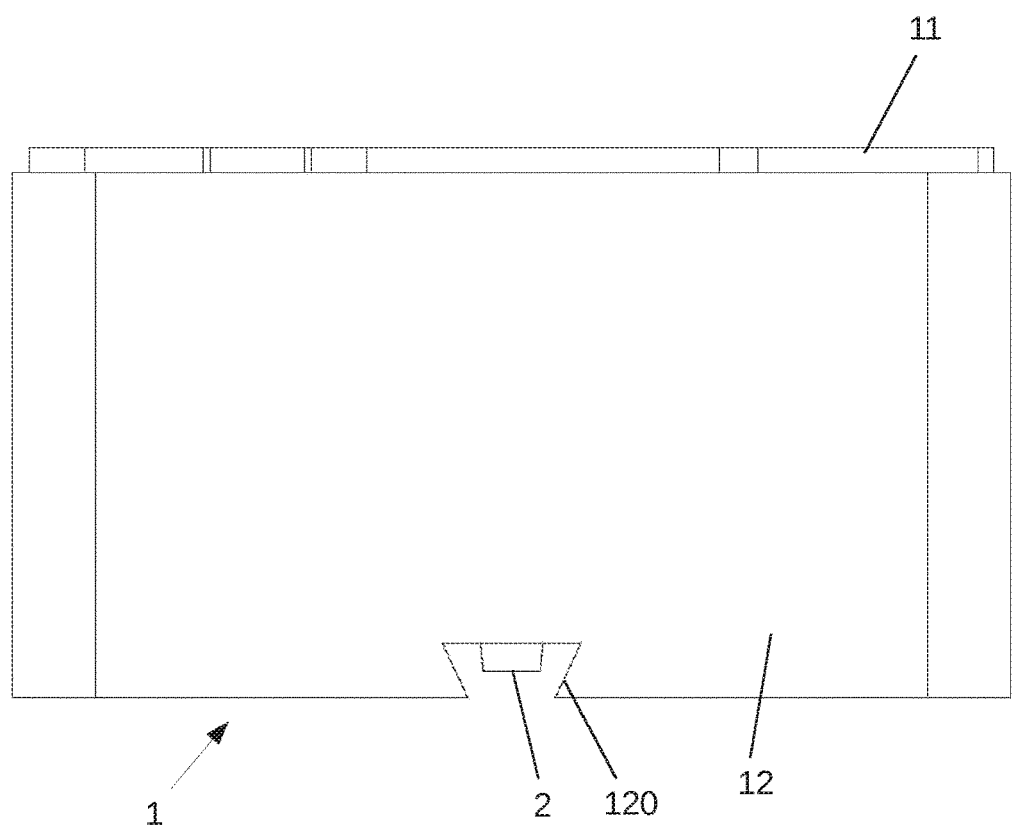
FIG. 2 is a side view of the housing.
Figure 4:
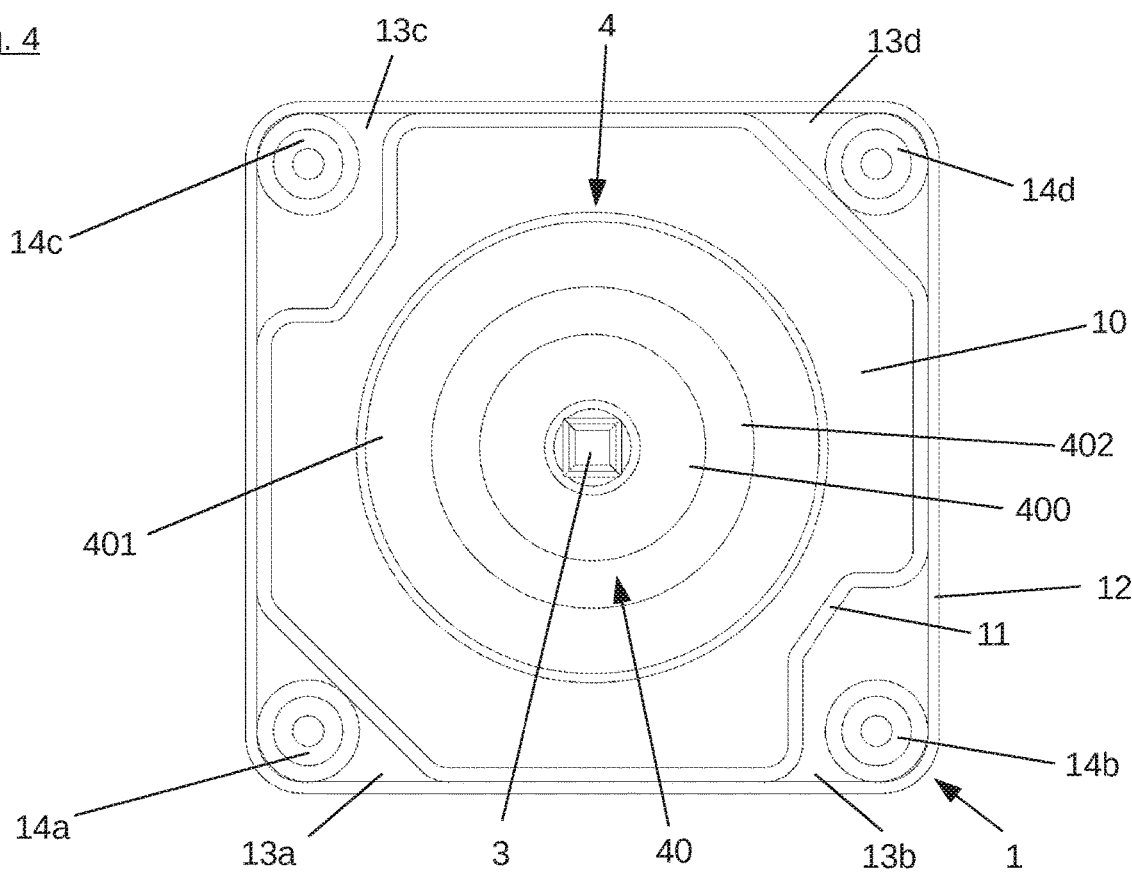
FIG. 4 is a plan view of the housing.

As can be seen in FIGS. 1 and 4, the inner housing wall 11 is spaced apart from the outer housing wall 12 in all four corner regions of the housing 1. As a result, gaps 13a, 13b, 13c, and 13d, within which respective hollow cylindrical receiving sections 14a, 14b, 14c, and 14d are formed, are respectively created in the four corner regions. The housing 1 can be closed by the housing cover, which is not shown in this case and which has in each of its four corner regions a respective insertion opening. After the housing cover has been placed on the housing 1, these insertion openings are aligned in each case with one of the hollow cylindrical receiving sections 14a, 14b, 14c, and 14d. Subsequently a respective mounting screw can be pushed through each of the insertion openings and screwed to the receiving section 14a, 14b, 14c, and 14d, which is aligned with the respective insertion opening. Preferably, the housing 1 comprises at least one tamper-proof mechanism, which is designed such that opening the housing 1 by removing the housing cover can be reliably detected. The tamper-proof mechanism may be, for example, a sticker, which may be pasted over a parting line between the housing 1 and the housing cover or at least one of the mounting screws. Opening the housing 1 leads to irreversible damage to the sticker and, as a result, can be reliably detected.

The housing bottom 10 comprises an elastically deformable connecting section 4, which comprises on an outer face at least one fastening element 2, which is designed such that it can be connected in a form-fitting manner to a corresponding retaining element, which is arranged on a machine or a technical system or even on a building wall. The fastening element 2 is integrally formed with the connecting section 4. The retaining element, to which the housing 1 is connected, may be, for example, part of a retaining rail, in particular, a top-hat rail, and may be designed preferably as a latching element. To this latching element the fastening element 2 can be locked during assembly and, in particular, without the housing 1 having to have been opened beforehand. The fastening element 2 is arranged in a central region of the outer face of the connecting section 4 and, as a result, is covered by the housing 1 after the fastening element has been fastened to the retaining element. This aspect gives rise to the advantage that the fastening element 2 is not accessible from the outside, and that the housing 1 can no longer be easily removed from the retaining element without destroying the housing.

Figure 3:
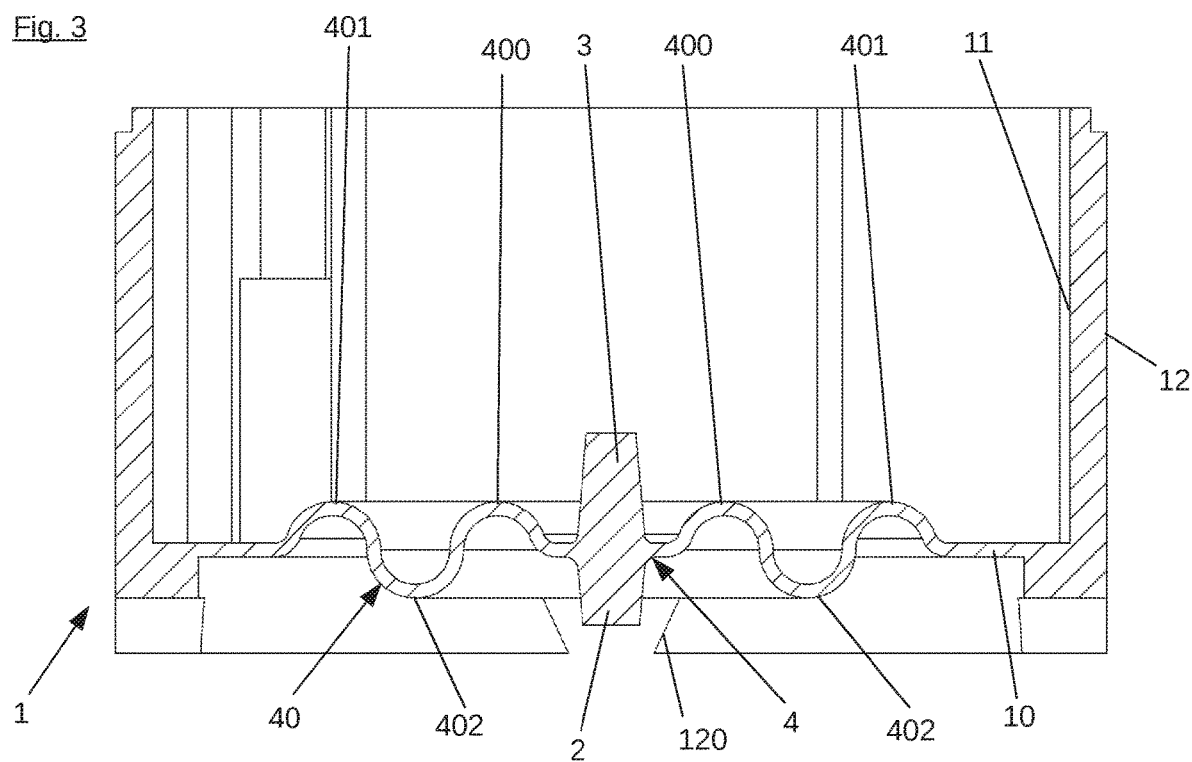
FIG. 3 is a longitudinal section through the housing.

In order to be able to easily release the housing 1 from the retaining element, for example, in the event of a defect, the housing bottom 10 is designed so as to be elastically deformable by providing the connecting section 4 in at least that region, in which the fastening element 2 is formed on the outer face. In order to reduce the stiffness and to provide the elastic deformability, the connecting section 4 exhibits a concentric undulating structure 40, which extends around the fastening element 2 and which is formed by two ring-shaped ridges 400, 401, which face the interior of the housing 1, and one ring-shaped, outwards facing indentation 402 between the two ridges 400, 401. The concentric undulating structure 40, which can be seen the best in FIG. 3, with the two ring-shaped ridges 400, 401 and the indentation 402, provided in-between, gives the connecting section 4 the necessary elasticity, so that the connecting section can be elastically deformed by the action of a compressive or tensile force. As can be seen in FIG. 3, the connecting section 4 comprises an unlocking element 3, which is opposite the fastening element 2 and extends into the interior of the housing 1. This unlocking element 3, the function of which will be explained in greater detail below, is also integrally formed with the connecting section 4. In order to show the above-explained concentric undulating structure 40 of the connecting section 4 with the ridges 400, 401 and the indentations 402, extending between the ridges, also in the perspective view from FIG. 1, two "undulating lines," which really do not exist and, therefore, are shown exclusively for visualization purposes, were deliberately sketched into the drawing on the left and right of the unlocking element 3.

The outer housing wall 12 comprises in a lower region of each of its four sides a respective recess 120, which is adapted to the contour of a retaining rail, to which the housing 1 is to be fastened. In the present case, the recesses 120 are shaped such that the housing 1 lends itself to being mounted on a retaining rail, which is shaped in a dovetail manner. The two recesses 120 of two opposite sides of the outer housing wall 12 are arranged such that they are aligned with each other, so that the housing 1 can be easily pushed onto the retaining rail during assembly. Due to the fact that a recess is provided on each side of the outer housing wall 12, the housing 1 can be mounted on the retaining rail in two different orientations, rotated by 90° to each other. When the fastening element is pushed onto the retaining rail, the fastening element 2 is first pressed inwards due to the contact with the retaining rail, so that the concentric undulating structure 40 deforms elastically inwards. When the fastening element 2 finally reaches the retaining element during the further displacement movement on the retaining rail, the fastening element 2 engages in a form-fitting manner in the retaining element and interlocks with it. The undulating structure 40 relaxes and, in so doing, secures the form-fitting connection of the fastening element 2 to the retaining element.

The housing 1 is hermetically sealed during operation, since it is closed by the housing cover. In order to be able to release the housing 1 from the retainer, for example, in the event of a defect in the electrical device, the mounting screws have to be loosened in a first step, so that the housing cover can be removed from the housing 1. In this case the tamper-proof mechanism of the housing 1 will be damaged. Then a user can grasp the unlocking element 3 with a gripping tool, in particular, with gripping pliers and can exert a tensile force on the unlocking element 3. The concentric undulating structure 40, extending around the fastening element 2 and around the unlocking element 3, is pulled inwards by the action of the tensile force and is elastically deformed such that the fastening element 2 is disengaged from the retaining element; and, thus, the form-fitting connection is released. Then the housing 1 can be pushed by a user along the retaining rail and finally removed from the retaining rail.

Preferably the entire housing 1 is formed in one piece. That means that the connecting section 4, which provides the locking and unlocking mechanism for the housing 1 with the fastening element 2 and with the unlocking element 3, is integrally formed with the housing bottom 10 and, as a result, is not a separate component to be mounted in an additional mounting step.

One advantage of the housing 1, disclosed herein, is that it can be fastened without tools to a retaining element, in particular, to a retaining element of a retaining rail, without it having to have been opened beforehand. The locking and unlocking mechanism, which is formed by the fastening element 2 and the unlocking element 3, is designed to be mechanically very robust and can make do without delicate components, which could be easily damaged and, as a result, could render the housing 1 unusable. An unauthorized as well as an authorized (in particular, for repair purposes) opening of the housing 1 can be detected later on due to the damage to the tamper-proof mechanism. As a result, the housing 1 also lends itself to electrical devices that are used in safety-critical machines or technical systems. Another advantage of the housing 1 is that it can be easily reused. For example, after a repair the housing 1 can be provided again with a tamper-proof mechanism and, in so doing, can be sealed, and is then ready to be reinstalled.

The housing 1 with the connecting section 4, which is integrally formed with the housing, can be produced very easily in a plastic injection molding process. The housing 1 is off tool. This means that after completion of the injection molding process no additional assembly steps are required to complete the housing 1. The production of the housing 1 together with the locking and unlocking mechanism is possible using a simple on-off tool.

In principle, it is also conceivable that the connecting section 4 is formed as a separate component, which is inserted into an appropriately shaped receiving opening, which is provided within the housing bottom 10, and which is fixed in the receiving opening. However, this variant has the drawback that the connection of the connecting section 4 to the housing 1 can be sealed only with considerable difficulty. Therefore, this embodiment is more suitable for housings 1 having a low level of protection.

In principle, it is also possible not to form the fastening element 2 and/or the unlocking element 3 integrally with the connecting section 4. However, this variant has the drawback that additional steps are necessary in order to produce the fastening element 2 and/or the unlocking element 3 and to fasten it/them to the connecting section 4. Hence, the integral design of the fastening element 2 and/or the unlocking element 3 with the connecting section 4 is considerably more advantageous.

What is claimed is:
1. A housing for an electrical device, comprising:
 a housing bottom including an elastically deformable connecting section to connect the housing to a machine, a technical system, or a building wall, wherein the housing is closeable by a housing cover;

at least one fastening element on an outer face of the connecting section, the fastening element being connectable in a form-fitting and/or friction-fitting manner to a corresponding retaining element of the machine, the technical system, or the building wall; and an unlocking element on an inner face of the connecting section and operatively connected to the fastening element, the unlocking element being user actuatable only from an inside of the housing when the housing is open in order to release the form-fitting and/or friction-fitting connection of the fastening element to the retaining element of the machine, the technical system, or the building wall, wherein the connecting section has a concentric, elastically deformable undulating structure extending around the fastening element and/or the unlocking element.

2. The housing of claim 1, wherein the fastening element and the unlocking element are arranged opposite one another on the connecting section.

3. The housing of claim 1, wherein the fastening element is integrally formed with the connecting section.

4. The housing of claim 1, wherein the unlocking element is integrally formed with the connecting section.

5. The housing of claim 1, wherein the unlocking element is configured to be grasped by a gripping tool.

6. The housing of claim 1, wherein the fastening element is releasable from the retaining element of the machine, the technical system, or the building wall in response to exertion of a tensile force.

7. The housing of claim 1, wherein the fastening element is releasable from the retaining element of the machine, the technical system or the building wall in response to exertion of a compressive force.

8. The housing of claim 1, wherein the elastically deformable undulating structure comprises at least two ring-shaped ridges and at least one ring-shaped indentation between the ridges.

9. The housing of claim 1, wherein the connecting section is integrally formed with the housing bottom.

* * * * *